US011410915B2

(12) United States Patent
Huang et al.

(10) Patent No.: US 11,410,915 B2
(45) Date of Patent: Aug. 9, 2022

(54) SEMICONDUCTOR PACKAGE STRUCTURE INCLUDING AN ENCAPSULANT HAVING A CAVITY EXPOSING AN INTERPOSER

(71) Applicant: Advanced Semiconductor Engineering, Inc., Kaohsiung (TW)

(72) Inventors: Yu-Che Huang, Kaohsiung (TW); Chang Chin Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/088,449

(22) Filed: Nov. 3, 2020

(65) Prior Publication Data

US 2022/0139812 A1    May 5, 2022

(51) Int. Cl.
| | |
|---|---|
| *H01L 23/495* | (2006.01) |
| *H01L 23/48* | (2006.01) |
| *H01L 23/28* | (2006.01) |
| *H01L 21/00* | (2006.01) |
| *H05K 7/00* | (2006.01) |
| *H05K 7/18* | (2006.01) |
| *H01R 9/00* | (2006.01) |
| *H01L 23/31* | (2006.01) |
| *H01L 21/48* | (2006.01) |
| *H01L 23/00* | (2006.01) |
| *H01L 21/56* | (2006.01) |
| *H01L 23/498* | (2006.01) |

(52) U.S. Cl.
CPC .... *H01L 23/49531* (2013.01); *H01L 21/4825* (2013.01); *H01L 21/4853* (2013.01); *H01L 21/56* (2013.01); *H01L 23/315* (2013.01); *H01L 23/3135* (2013.01); *H01L 23/4952* (2013.01); *H01L 23/49558* (2013.01); *H01L 24/17* (2013.01); *H01L 24/48* (2013.01); *H01L 24/49* (2013.01); *H01L 24/73* (2013.01); *H01L 23/49513* (2013.01); *H01L 23/49827* (2013.01); *H01L 23/49838* (2013.01); *H01L 2224/48157* (2013.01); *H01L 2224/49175* (2013.01); *H01L 2224/73265* (2013.01); *H01L 2924/181* (2013.01)

(58) Field of Classification Search
CPC ..... H01L 25/0657; H01L 24/48; H01L 24/49; H01L 24/73; H01L 21/4825; H01L 21/4853; H01L 21/56; H01L 23/49531; H01L 23/3135; H01L 23/315; H01L 23/4952; H01L 23/49558; H01L 2924/181; H01L 24/17; H01L 23/5385
See application file for complete search history.

(56) References Cited

U.S. PATENT DOCUMENTS

2007/0257348 A1* 11/2007 Yang .................... H01L 23/3128
                                                                257/686
2008/0272477 A1* 11/2008 Do ......................... H01L 24/24
                                                                257/686

(Continued)

*Primary Examiner* — Alonzo Chambliss
(74) *Attorney, Agent, or Firm* — Foley & Lardner LLP

(57) ABSTRACT

A semiconductor package structure and a method for manufacturing a semiconductor package structure are provided. The semiconductor package structure includes a carrier, a first encapsulant, and an interposer. The first encapsulant is on the carrier and defines a cavity. The interposer is disposed between the first encapsulant and the cavity. The first encapsulant covers a portion of the interposer.

18 Claims, 8 Drawing Sheets

(56) References Cited

U.S. PATENT DOCUMENTS

| | | | | |
|---|---|---|---|---|
| 2009/0155961 A1* | 6/2009 | Ko | ............... | H01L 23/3121 |
| | | | | 438/127 |
| 2009/0243073 A1* | 10/2009 | Carson | ............... | H01L 25/03 |
| | | | | 257/686 |
| 2010/0133675 A1* | 6/2010 | Yu | ............... | H01L 25/105 |
| | | | | 257/686 |
| 2012/0217659 A1* | 8/2012 | Chow | ............... | H01L 23/3128 |
| | | | | 257/778 |
| 2012/0228753 A1* | 9/2012 | Ko | ............... | H01L 23/49833 |
| | | | | 257/667 |
| 2012/0306102 A1* | 12/2012 | Cho | ............... | H01L 25/105 |
| | | | | 257/777 |
| 2012/0319267 A1* | 12/2012 | Moon | ............... | H01L 23/3128 |
| | | | | 257/713 |
| 2013/0075889 A1* | 3/2013 | Pagaila | ............... | H01L 23/4334 |
| | | | | 257/713 |
| 2013/0249101 A1* | 9/2013 | Lin | ............... | H01L 24/20 |
| | | | | 257/773 |
| 2016/0079214 A1* | 3/2016 | Caskey | ............... | H01L 21/486 |
| | | | | 257/686 |

* cited by examiner

SEMICONDUCTOR PACKAGE STRUCTURE INCLUDING AN ENCAPSULANT HAVING A CAVITY EXPOSING AN INTERPOSER

BACKGROUND

1. Technical Field

The present disclosure relates generally to a semiconductor package structure and a method for manufacturing a semiconductor package structure.

2. Description of the Related Art

Along with the increasing technical advance of package technology, package sizes are decreased, and various structures are developed. For example, MEMS packages are provided with advantages of high strength, high performance, and low cost; thus the development of MEMS packages has become increasingly important in package technology.

Open cavity packages (e.g., OCQFN and OCDFN) are widely used for IC packaging and IC assemblies. However, some partially embedded die may be sensitive to the stress caused during the molding operation and/or by the molding compound per se. On the other hand, even for the type of open cavity package which does not impose the molding compound directly on the semiconductor die, the aforesaid package structure may render semiconductor chips with high I/O counts difficult to be implemented due to the limited connection lead count design.

SUMMARY

In one or more embodiments, a semiconductor package structure includes a carrier, a first encapsulant, and an interposer. The first encapsulant is on the carrier and defines a cavity. The interposer is disposed between the first encapsulant and the cavity. The first encapsulant covers a portion of the interposer.

In one or more embodiments, a semiconductor package structure includes an interposer, a first conductive element, a second conductive element, and a first encapsulant. The first conductive element and the second conductive element are disposed on the interposer. The first encapsulant covers the second conductive element and exposes the first conductive element.

In one or more embodiments, a method for manufacturing a semiconductor package structure includes the following operations: providing a carrier; disposing an interposer on the carrier; and forming a first encapsulant covering a portion of the interposer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
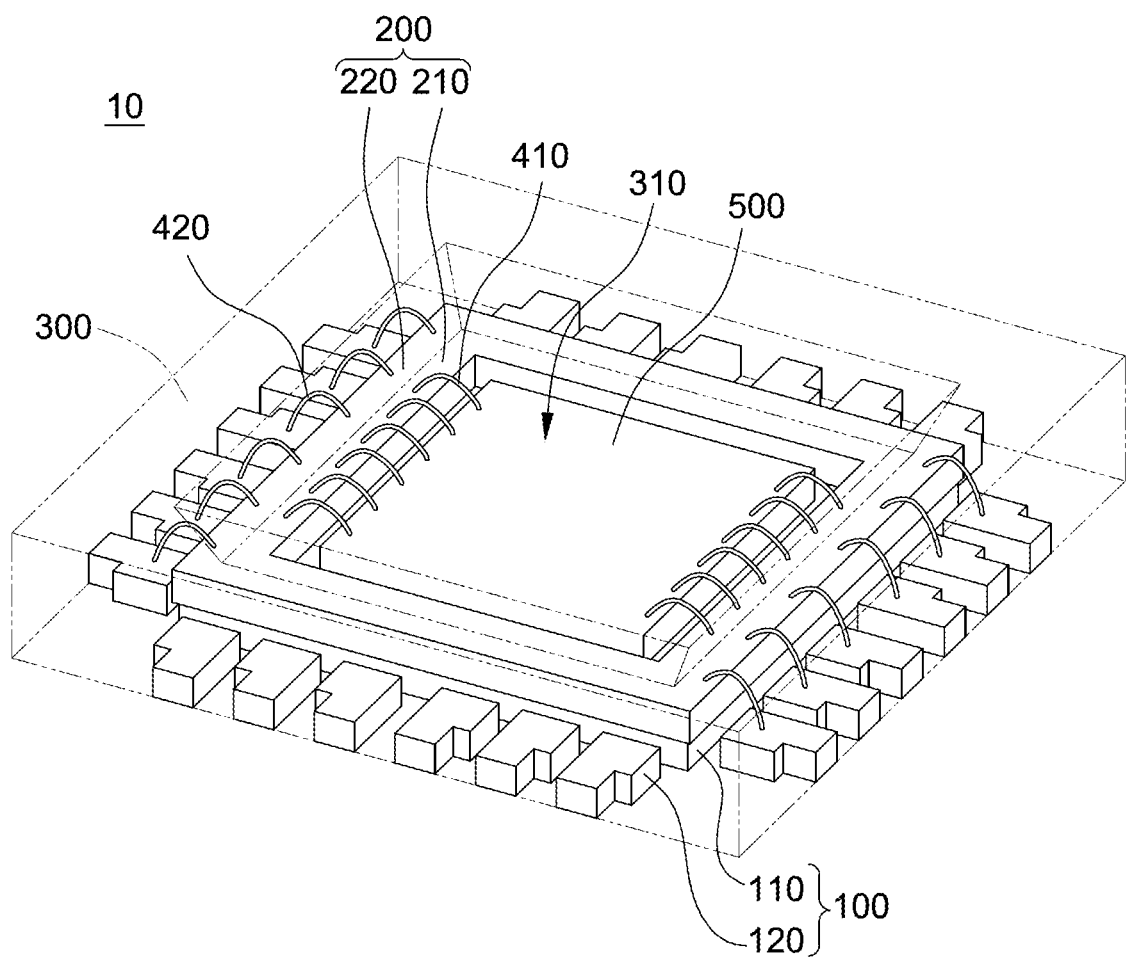
FIG. 1 illustrates a perspective view of a semiconductor package structure in accordance with some embodiments of the present disclosure.

FIG. 1 illustrates a perspective view of a semiconductor package structure 10 in accordance with some embodiments of the present disclosure. The semiconductor package structure 10 includes a carrier 100, an interposer 200, an encapsulant 300, conductive elements 410 and 420, and a semiconductor device 500.

The carrier 100 may include a substrate, such as an organic substrate or a lead frame. In some embodiments, the carrier 100 includes a portion 110 and a portion 120 spaced apart from the portion 110 from a cross sectional perspective. In some embodiments, the portion 110 of the carrier 100 includes a paddle or a die paddle, and the portion 120 of the carrier 100 includes one or more leads. In some embodiments, the carrier 100 includes one portion 110 (also referred to as "a die paddle") and a plurality of portions 120 (also referred to as "leads") spaced apart from the portion 110. In some embodiments, the portion 110 is surrounded by the portions 120.

The encapsulant 300 is on the carrier 100 and defines a cavity 310. In some embodiments, the encapsulant 300 covers the portions 120 of the carrier 100. In some embodiments, the encapsulant 300 partially covers the portion 110 of the carrier 100 from a top view perspective. In some embodiments, the encapsulant 300 may include an epoxy resin having fillers, a molding compound (e.g., an epoxy molding compound or other molding compound), polyimide, a phenolic compound or material, a material with a silicone dispersed therein, or a combination thereof. In some embodiments, the encapsulant 300 has a density of about 2 g/cm$^3$.

The interposer 200 is disposed between the encapsulant 300 and the cavity 310. In some embodiments, the encapsulant 300 covers a portion of the interposer 200. In some embodiments, the interposer 200 includes a region 210 and a region 220 adjacent to the region 210. In some embodiments, the region 220 of the interposer 200 surrounds the region 210 of the interposer 200. In some embodiments, the encapsulant 300 covers the region 220 of the interposer 200 and exposes the region 210 of the interposer 200. In some embodiments, the region 210 of the interposer 200 is exposed from the cavity 310.

The semiconductor device 500 is disposed on the carrier 100 and exposed from the encapsulant 300. In some embodiments, the semiconductor device 500 is disposed on the portion 110 (also referred to as "the die paddle") of the carrier 100 (also referred to as "the lead frame") and exposed from the encapsulant 300. In some embodiments, the semiconductor device 500 is surrounded by the interposer 200. In some embodiments, the semiconductor device 500 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the semiconductor device 500 may be or include a sensing device, such as a sensing chip.

The conductive element 410 (also referred to as "an inner conductive element") is disposed on the interposer 200. In some embodiments, the conductive element 410 is connected to the region 210 of the interposer 200. In some embodiments, the conductive element 410 connects the interposer 200 and the semiconductor device 500. In some embodiments, the conductive element 410 electrically connects the interposer 200 and the semiconductor device 500. In some embodiments, the semiconductor package structure 10 includes a plurality of the conductive elements 410. In some embodiments, the conductive elements 410 are connected to the interposer 200 and the semiconductor device 500. In some embodiments, the conductive elements 410 are connected to the region 210 of the interposer 200 and the semiconductor device 500. In some embodiments, the conductive element 410 may be or include a conductive wire (also referred to as "a wire bond").

The conductive element 420 (also referred to as "an outer conductive element") is disposed on the interposer 200. In some embodiments, the conductive element 420 is connected to the region 220 of the interposer 200. In some embodiments, the conductive element 420 connects the interposer 200 and the portion 120 of the carrier 100. In some embodiments, the conductive element 420 electrically connects the carrier 100 and the interposer 200. In some embodiments, the encapsulant 300 covers the conductive element 420. In some embodiments, the encapsulant 300 covers the conductive element 420 and exposes the conductive element 410. In some embodiments, the semiconductor package structure 10 includes a plurality of the conductive elements 420 respectively connected to the portions 120 of the carrier 100. In some embodiments, the encapsulant 300 covers the conductive elements 420 and the portions 120 of the carrier 100. In some embodiments, the conductive element 420 may be or include a conductive wire (also referred to as "a wire bond").

In some embodiments, the semiconductor device 500 is electrically connected to the carrier 100 (also referred to "the lead frame") through the conductive element 410 and the conductive element 420. In some embodiments, the semiconductor device 500 is electrically connected to the portions 120 (also referred to "the leads") of the carrier 100 through the conductive element 410 and the conductive element 420. In some embodiments, the semiconductor device 500 is electrically connected to the portions 120 of the carrier 100 through the conductive element 410, the interposer 200, and the conductive element 420.

In some comparative embodiments, a semiconductor device is partially embedded in an open cavity package where the molding compound is directly contacting a periphery and exposing a center of the semiconductor device. For example, the semiconductor device is first wire bonded to the substrate (e.g., lead frame) and then followed by an encapsulation operation. This open cavity package configuration cannot be implemented on the semiconductor device that is sensitive to stress (e.g., a stress sensor) regardless the stress being imposed during the course of molding operation or after the molding compound is formed.

In some comparative embodiments, a semiconductor device is integrated in an open cavity package where the molding compound exposes the semiconductor device. For example, the encapsulation operation is first performed to encapsulate a periphery of the paddle and some of the leads and then followed by bonding the semiconductor device to the paddle. A first type of I/Os of the semiconductor device is wire bonded to the paddle (e.g., all the first type I/Os are connected to a common ground on the paddle), where the conductive signal is further picked up by a separate conductive patterns connected to the leads from the paddle. A second type of I/Os of the semiconductor device are wire bonded from the semiconductor device to the leads that are not encapsulated by the molding compound. As a result, when the I/Os of the semiconductor device is high, there may be insufficient leads which are unencapsulated for the second type of I/Os.

Present disclosure provides a semiconductor package structure that can integrate the stress-sensitive semiconductor device by open cavity package configuration, and at the same time provide sufficient connection terminals to accommodate the high I/O count of the semiconductor device.

According to some embodiments of the present disclosure, the interposer 200 can serve as a transition hub for wire bonds (e.g., the conductive elements 410 and 420) that connect the semiconductor device 500 to the portions 120 (e.g., leads of a lead frame); for example, the interposer 200 may provide multiple conductive pads/layers (e.g., metal routings) that individually connect multiple I/O terminals of the semiconductor device 500 to the multiple portions 120 (e.g., the leads of a lead frame). Therefore, with the design of the interposer 200, the I/O counts of the semiconductor device 500 can be increased, and the flexibility of I/O layouts of the semiconductor package structure 10 can be increased as well.

In addition, according to some embodiments of the present disclosure, the semiconductor device 500 and a portion of the interposer 200 are exposed from the cavity 310 of the encapsulant 300, such that the semiconductor device 500 is free from stress or pressure applied from the encapsulant 300, and thus the stability and reliability of the semiconductor device 500 of the semiconductor package structure 10 can be improved.

Figure 2:
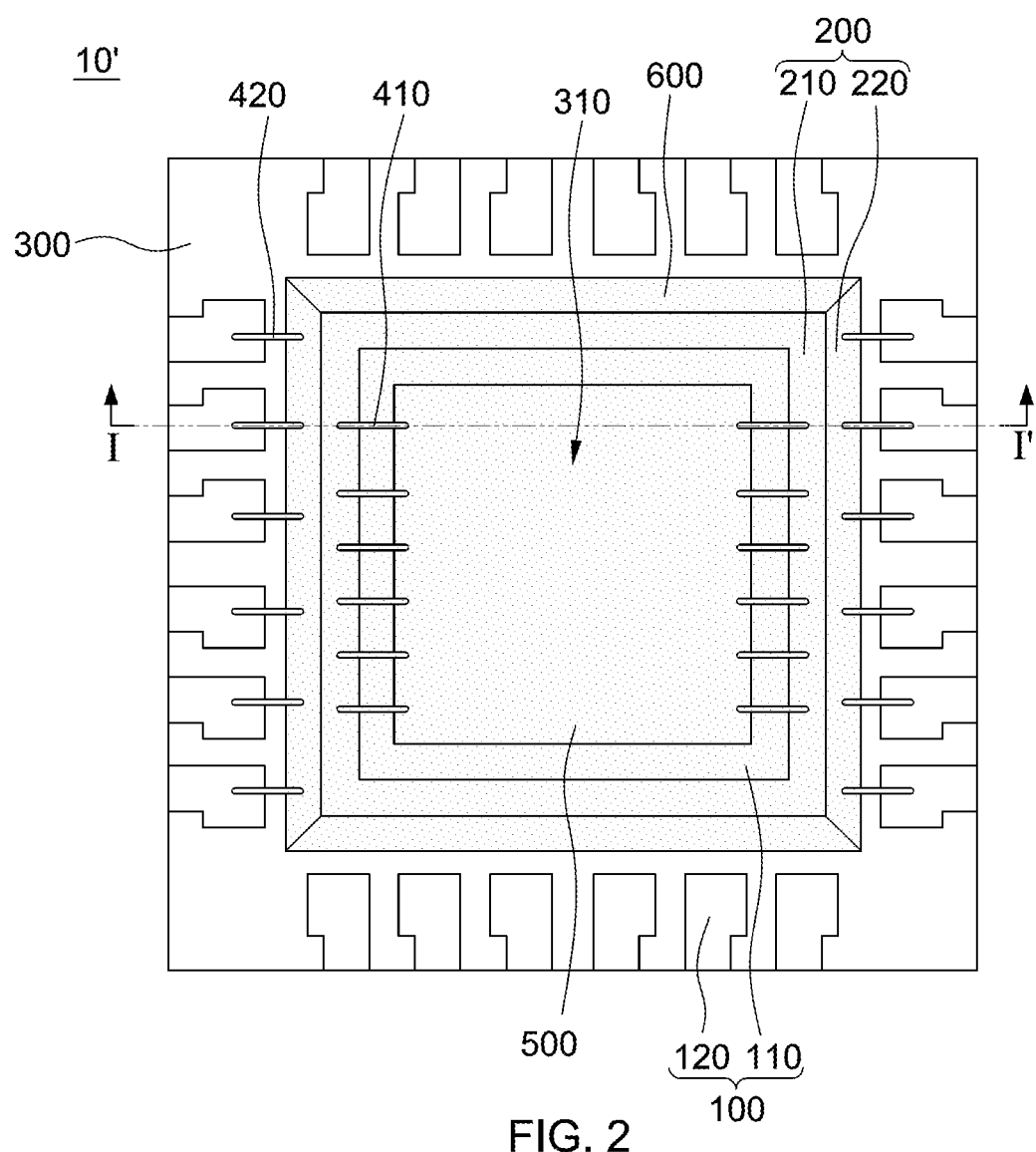
FIG. 2 illustrates a top view of a semiconductor package structure in accordance with some embodiments of the present disclosure.

FIG. 2 illustrates a top view of a semiconductor package structure 10' in accordance with some embodiments of the present disclosure. In some embodiments, FIG. 2 illustrates a top view of the structure shown in FIG. 1.

In some embodiments, the semiconductor package structure 10' further includes an encapsulant 600. In some embodiments, the encapsulant 600 covers the conductive elements 410 and the semiconductor device 500. In some embodiments, the encapsulant 600 directly contacts the encapsulant 300. In some embodiments, the encapsulant 600 may be or include a protective gel layer. In some embodiments, the encapsulant 600 may include an epoxy resin substantially free of fillers, a molding compound (e.g., an epoxy molding compound or other molding compound), polyimide, a phenolic compound or material, or a combination thereof. In some embodiments, the stress or pressure applied from the encapsulant 600 on the device there-below is lower than that from the encapsulant 300. In some embodiments, the sizes of fillers and/or contents of the materials of the encapsulant 300 and the encapsulant 600 are specially designed so as to generate the aforesaid results. In some embodiments, a density of the encapsulant 600 is lower than a density of the encapsulant 300. In some embodiments, the density of the encapsulant 600 is from about 0.9 g/cm$^3$ to about 1.2 g/cm$^3$. According to some embodiments of the present disclosure, the stress or pressure applied from the encapsulant 600 does not damage the semiconductor device 500 and the conductive elements 410, and thus the semiconductor device 500 and the conductive elements 410 can be protected by the encapsulant 600 without reducing the stability and the reliability of the semiconductor device 500 of the semiconductor package structure 10'.

In some embodiments, the portions 120 of the carrier 100 are spaced apart from the interposer 200. In some embodiments, the portions 120 of the carrier 100 surround the interposer 200. In some embodiments, the semiconductor device 500 is spaced apart from the interposer 200. In some embodiments, a region of the portion 110 of the carrier 100 between the semiconductor device 500 and the interposer 200 is exposed from the cavity 310 from a top view perspective. In some embodiments, a region of the portion 110 of the carrier 100 directly under the conductive elements 410 is exposed from the cavity 310 from a top view perspective.

Figure 3:
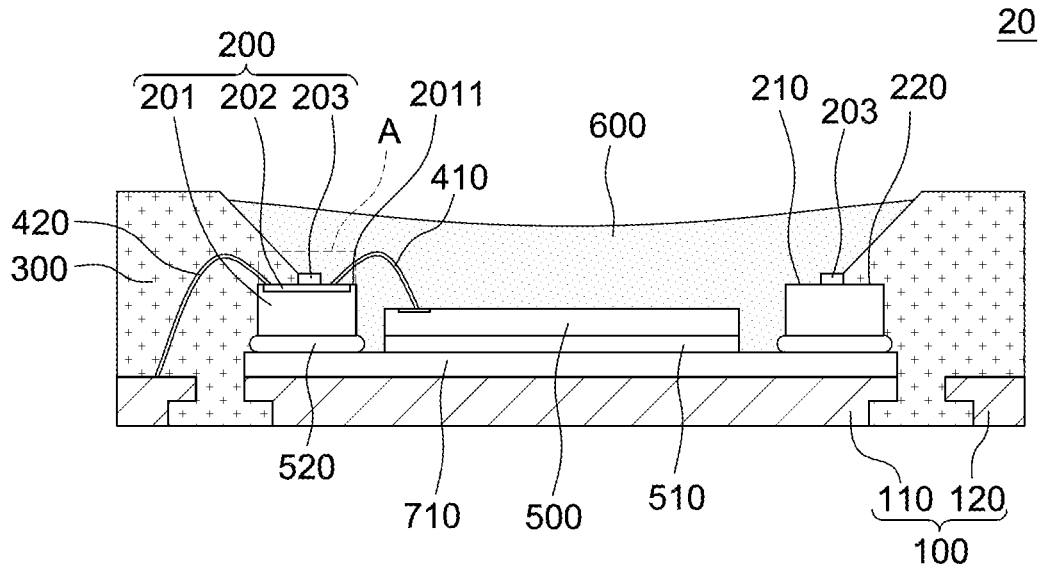
FIG. 3 illustrates a cross-sectional view of a semiconductor package structure in accordance with some embodiments of the present disclosure.

FIG. 3 illustrates a cross-sectional view of a semiconductor package structure 20 in accordance with some embodiments of the present disclosure. The semiconductor package structure 20 is similar to the semiconductor package structure 10 in FIG. 1 except that, for example, the interposer 200 of the semiconductor package structure 20 includes a dam 203, and the semiconductor package structure 20 further includes an insulating layer 710. In some embodiments, FIG. 3 may illustrate a cross-sectional view along the cross-sectional line I-I' in FIG. 2.

In some embodiments, the interposer 200 may include a base layer 201, a conductive layer 202, and a dam 203. In some embodiments, the conductive layer 202 is proximate to a surface 2011 (also referred to as "an upper surface") of the base layer 201. In some embodiments, the conductive element 410 and the conductive element 420 are connected to the conductive layer 202 of the interposer 200. In some embodiments the conductive element 410 is electrically connected to the conductive element 420 through the conductive layer 202 of the interposer 200. In some embodiments, the conductive layer 202 may include a plurality of conductive sub-layers each electrically connecting one of the conductive elements 410 and one of the conductive elements 420. According to some embodiments of the present disclosure, the pattern and/or the arrangement of the conductive layer 202 may vary according to actual I/O counts and I/O layout design of the semiconductor package structure 20, and thus the I/O layouts and the I/O counts of the semiconductor package structure 20 can be designed according to needs without significant constraint.

In embodiments, the dam 203 is disposed on the base layer 201. In some embodiments, the dam 203 is protruded from the surface 2011 (also referred to as "the upper surface") of the base layer 201. In some embodiments, the dam 203 is disposed between the region 210 and the region 220. In some embodiments, the dam 203 is at an interface between the region 210 and the region 220. In some embodiments, also referring to FIG. 2, the dam 203 extends along the interface between the region 210 and the region 220 and thereby surrounds the region 210 of the interposer 200. In some embodiments, the dam 203 has a substantially continuous ring-shaped structure from a top view perspective. According to some embodiments of the present disclosure, the molding compound for forming the encapsulant 300 can be effectively stopped by the dam 203 from overflowing towards the semiconductor device 500 in the manufacturing process, such that residue or contamination of the molding compound is not formed on the semiconductor device 500, and thus the reliability of the process for forming the semiconductor package structure 20 can be increased.

The insulating layer 710 (also referred to as "the isolation layer" or "the spacer layer") is disposed between the semiconductor device 500 and the portion 110 (also referred to as "the die paddle") of the carrier 100. In some embodiments, the insulating layer 710 provides electrical isolation between the semiconductor device 500 and the portion 110 of the carrier 100. In some embodiments, the insulating layer 710 includes, for example, one or more organic materials (e.g., a molding compound, bismaleimide triazine (BT), polyimide (PI), polybenzoxazole (PBO), a solder resist, an Ajinomoto build-up film (ABF), polypropylene (PP), an epoxy-based material, or a combination of two or more thereof), inorganic materials (e.g., silicon, glass, ceramic, quartz, or a combination of two or more thereof), liquid-film material(s) or dry-film material(s), or a combination of two or more thereof. In some embodiments, the insulating layer 710 may be or include an isolation tape. In some embodiments, the insulating layer 710 has a relatively high resistance that can provide sufficient electrical isolation between the semiconductor device 500 and the portion 110 of the carrier 100.

In some embodiments, the semiconductor device 500 is attached to the portion 110 of the carrier 100 through an adhesive layer 510. In some embodiments, the semiconductor device 500 is attached to the insulating layer 710 on the portion 110 of the carrier 100 through the adhesive layer 510. In some embodiments, the adhesive layer 510 may be or include a die attach film (DAF) or an epoxy-based adhesive layer. In some embodiments, the interposer 200 is attached to the portion 110 of the carrier 100 through an adhesive layer 520. In some embodiments, the interposer 200 is attached to the insulating layer 710 on the portion 110 of the carrier 100 through the adhesive layer 520. In some embodiments, the adhesive layer 520 may be or include a non-conductive epoxy resin.

Figure 3A:
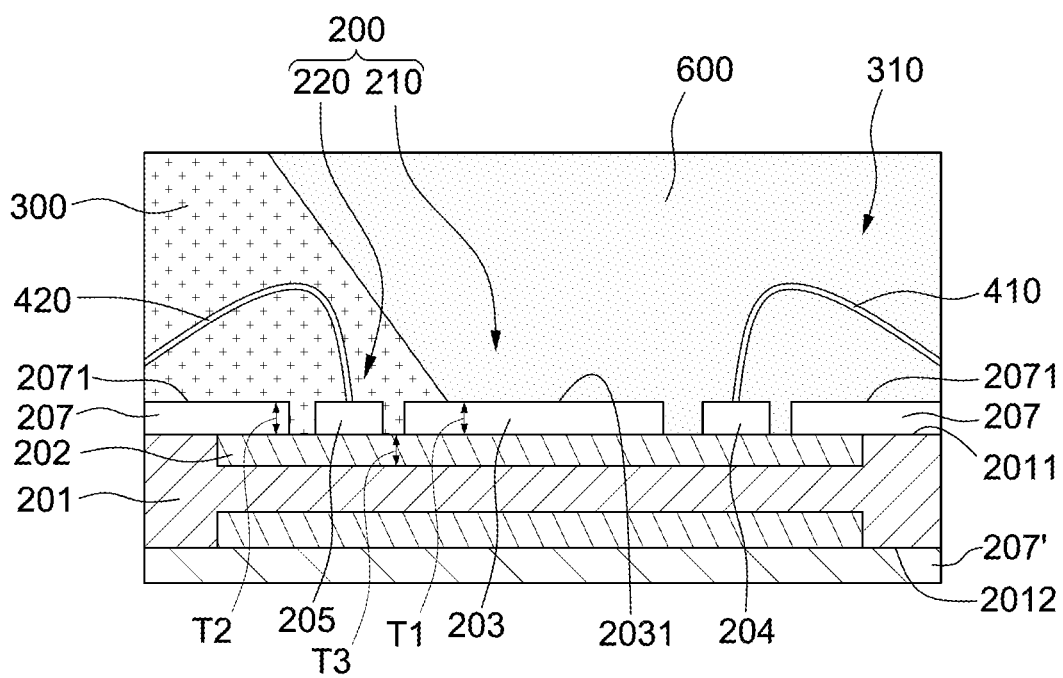
FIG. 3A illustrates an enlarged cross-sectional view of a portion of a semiconductor package structure in accordance with some embodiments of the present disclosure.

FIG. 3A illustrates an enlarged cross-sectional view of a portion of a semiconductor package structure 20 in accordance with some embodiments of the present disclosure. In some embodiments, FIG. 3A illustrates a cross-sectional view of the structure shown in the dashed box A in FIG. 3.

In some embodiments, the dam 203 is disposed on the base layer 201 and adjacent to the region 220 of the interposer 200. In some embodiments, the dam 203 is disposed on the conductive layer 202 and between the conductive element 410 and the conductive element 420. In some embodiments, the encapsulant 300 directly contacts the dam 203 of the interposer 200. In some embodiments, the encapsulant 600 directly contacts the dam 203 of the interposer 200. In some embodiments, at least a portion of the dam 203 is exposed to the cavity 310. In some embodiments, the dam 230 is a solder mask pattern between the conductive element 410 and the conductive element 420.

In some embodiments, the interposer 200 further includes conductive pads 204 and 205 on the conductive layer 202, a solder mask 207 on a surface 2011 (also referred to as "an upper surface") of the base layer 201, and a solder mask 207' on a surface 2012 (also referred to as "a bottom surface") of the base layer 201 facing away from the dam 203. In some embodiments, a thickness T1 of the dam 203 is substantially the same as a thickness T2 of the solder mask 207. In some embodiments, a thickness T3 of the conductive layer 202 is less than the thickness T1 of the dam 203. In some embodiments, the thickness T1 of the dam 203 is greater than about 10 μm. In some embodiments, the thickness T1 of the dam 203 is greater than about 20 μm. In some embodiments, the thickness T3 of the conductive layer 202 is less than about 20 μm.

In some embodiments, the conductive element 410 is electrically connected to the conductive layer 202 through the conductive pad 204. In some embodiments, the conductive element 420 is electrically connected to the conductive layer 202 through the conductive pad 205. In some embodiments, an upper surface 2031 of the dam 203 is substantially coplanar with an upper surface 2071 of the solder mask 207.

Figure 3B:
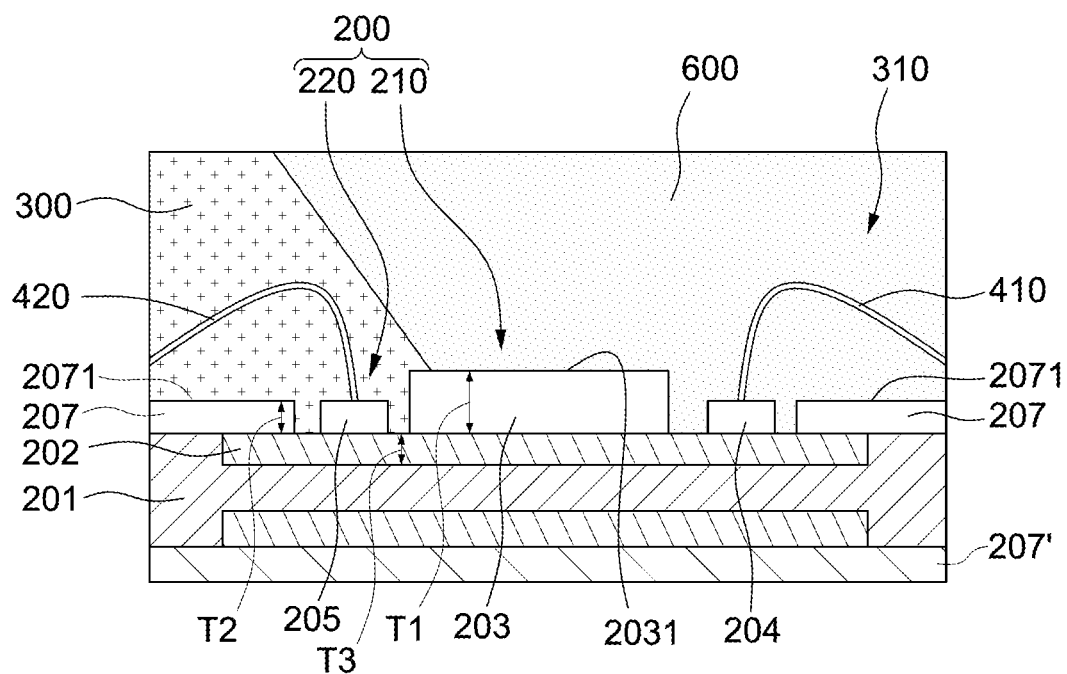
FIG. 3B illustrates an enlarged cross-sectional view of a portion of a semiconductor package structure in accordance with some embodiments of the present disclosure.

FIG. 3B illustrates an enlarged cross-sectional view of a portion of a semiconductor package structure 20 in accordance with some embodiments of the present disclosure. In some embodiments, FIG. 3B illustrates a cross-sectional view of the structure shown in the dashed box A in FIG. 3. The structure shown in FIG. 3B is similar to the structure shown in FIG. 3A except that, for example, the interposer 200 has a different structure.

In some embodiments, the upper surface 2031 of the dam 203 is at a higher elevation than that of the upper surface 2071 of the solder mask 207. In some embodiments, a thickness T1 of the dam 203 is greater than a thickness T2 of the solder mask 207. According to some embodiments of the present disclosure, with the design of the dam 203 being taller than the solder mask 207, the molding compound for forming the encapsulant 300 can be effectively stopped by the dam 203 from overflowing towards the semiconductor device 500 in the manufacturing process, such that residue or contamination of the molding compound is not formed on the semiconductor device 500, and thus the reliability of the process for forming the semiconductor package structure 20 can be increased.

Figure 3C:
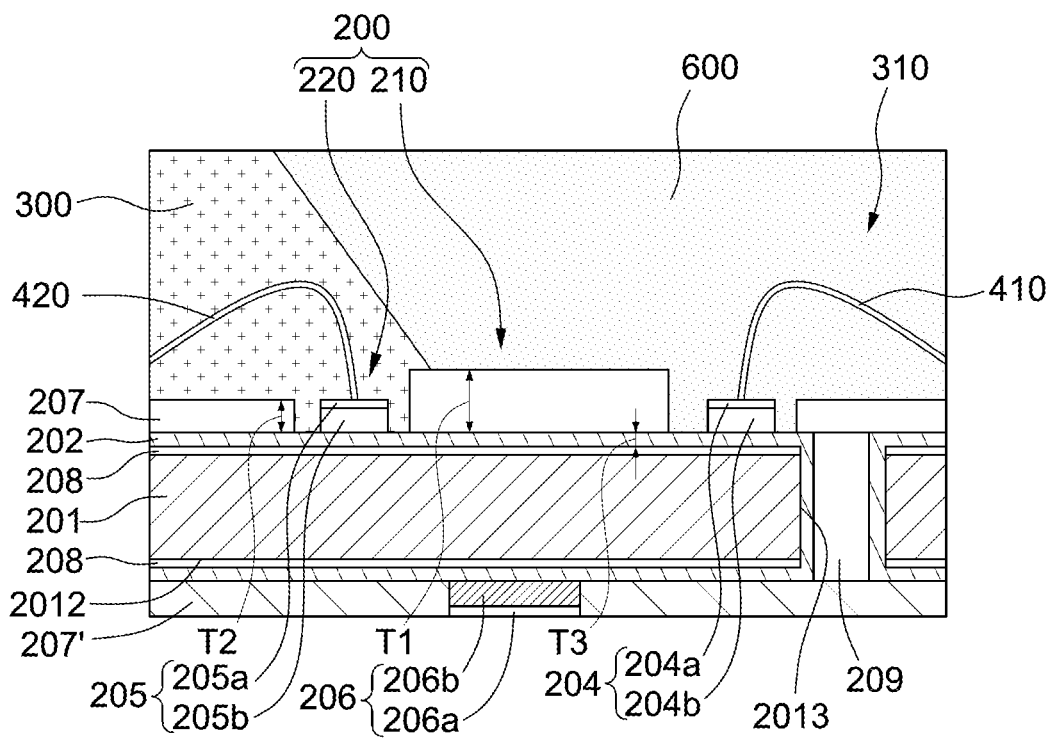
FIG. 3C illustrates an enlarged cross-sectional view of a portion of a semiconductor package structure in accordance with some embodiments of the present disclosure.

FIG. 3C illustrates an enlarged cross-sectional view of a portion of a semiconductor package structure 20 in accordance with some embodiments of the present disclosure. In some embodiments, FIG. 3C illustrates a cross-sectional view of the structure shown in the dashed box A in FIG. 3. The structure shown in FIG. 3C is similar to the structure shown in FIG. 3B except that, for example, the interposer 200 has a different structure.

In some embodiments, the interposer 200 further includes a conductive pad 206 on the surface 2012 (also referred to as "the bottom surface") of the base layer 201 facing away from the dam 203. In some embodiments, the conductive pad 204 includes sub-layers 204a and 204b, the conductive pad 205 includes sub-layers 205a and 205b, and the conductive pad 206 includes sub-layers 206a and 206b. In some embodiments, the sub-layers 204a, 205a and 206a may be or include gold layers, and the sub-layers 204b, 205b and 206b may be or include nickel layers.

In some embodiments, the interposer 200 further includes metal foil layers 208 on the surface 2011 and the surface 2012 (e.g., the upper and bottom surfaces) of the base layer 201. In some embodiments, the conductive layer 202 is formed on the metal foil layers 208 and a surface 2013 (also referred to as "a lateral surface") of the base layer 201. In some embodiments, the interposer 200 further includes a through hole 209 that is surrounded by the conductive layer 202 and penetrates through the base layer 201. In some embodiments, the base layer 201 and the through hole 209 may be or include epoxy resin having fillers. In some embodiments, the conductive layer 202 may be or include a copper layer. In some embodiments, the metal foil layers 208 may be or include copper foils.

Figure 4A:
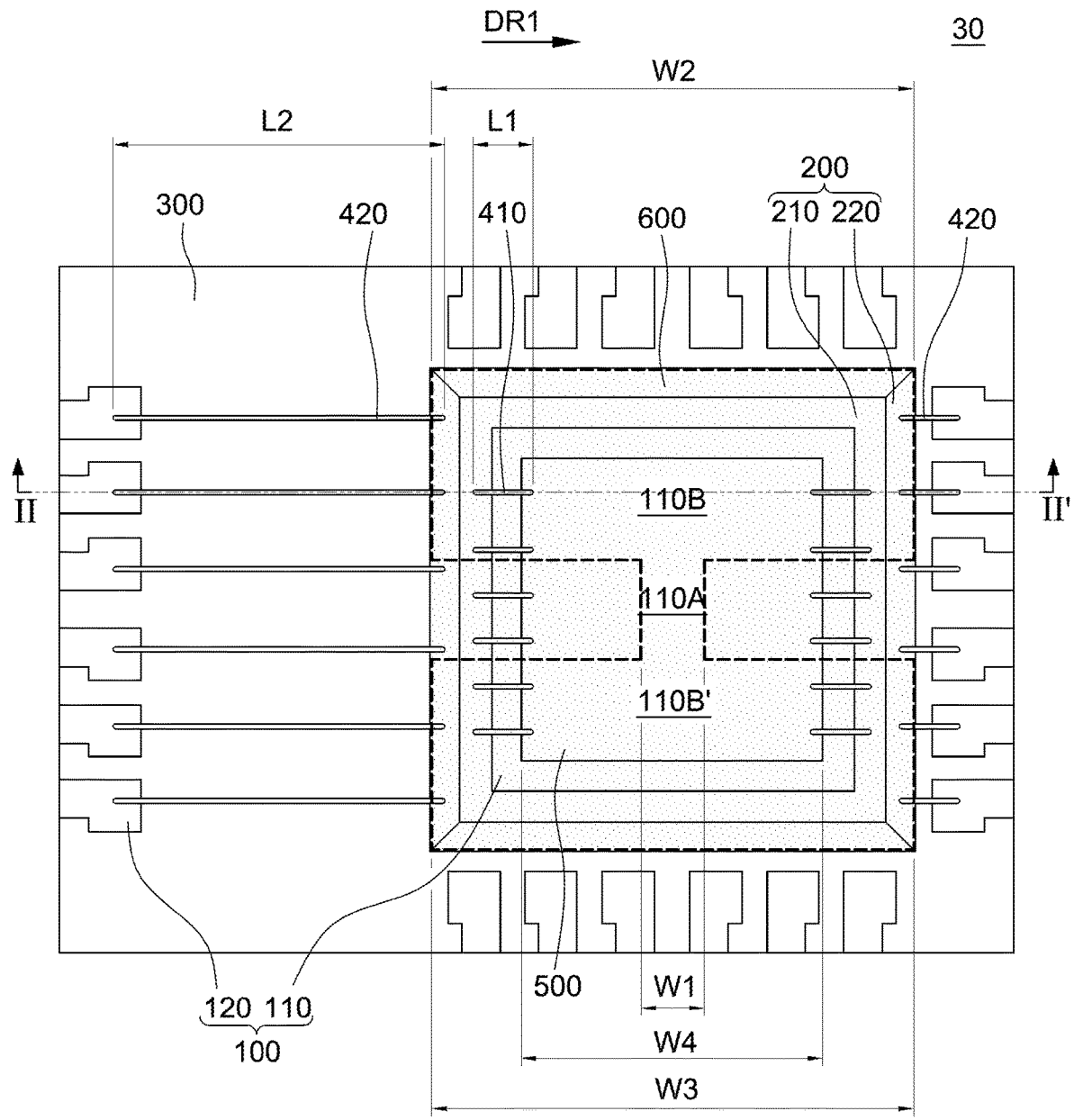
FIG. 4A illustrates a top view of a semiconductor package structure in accordance with some embodiments of the present disclosure.

FIG. 4A illustrates a top view of a semiconductor package structure 30 in accordance with some embodiments of the present disclosure. The semiconductor package structure 30 is similar to the semiconductor package structure 10' in FIG. 2 except that, for example, the carrier 100 of the semiconductor package structure 30 has a different structure.

In some embodiments, the portion 110 of the carrier 100 includes a segment 110B, a segment 110B', and a segment 110A between the segment 110B and the segment 110B'. In some embodiments, the segment 110A has a width W1 that is less than a width W2 of the segment 110B and a width W3 of the segment 110B', so as to form an I-shaped portion 110 of the carrier 100. In some embodiments, the semiconductor device 500 may serve as a hall sensor to detect the magnetic field density around the semiconductor device 500 generated by the current passing through the segments 110B, 110A, and 110B' of the portion 110 of the carrier 100 under the semiconductor device 500. In some embodiments, the insulating layer 710 may be or include an isolation tape. In some embodiments, the insulating layer 710 has a relatively high resistance that can provide sufficient electrical isolation between the semiconductor device 500 and the portion 110 of the carrier 100.

In some embodiments, a length L2 of the conductive element 420 is greater than a length L1 of the conductive element 410. In some embodiments, a length L2 of the conductive element 420 along a direction DR1 is greater than a length L1 of the conductive element 410 along the direction DR1. According to some embodiments of the present disclosure, the conductive element 420 having a relatively long length is advantageous to reduction of interference from the magnetic field generated by the current passing through the portion 110 of the carrier 100. In addition, according to some embodiments of the present disclosure, the arrangement of the interposer 200 can serve as a transition hub for connecting the conductive element 410 and the conductive element 420, and thus the interposer 200 allows the conductive element 420 to have a relatively long length which is advantageous to reduction of the aforesaid interference from the magnetic field. Therefore, in some embodiments, the semiconductor device 500 may serve as a hall sensor with reduced signal interference and improved electrical performance.

Figure 4B:
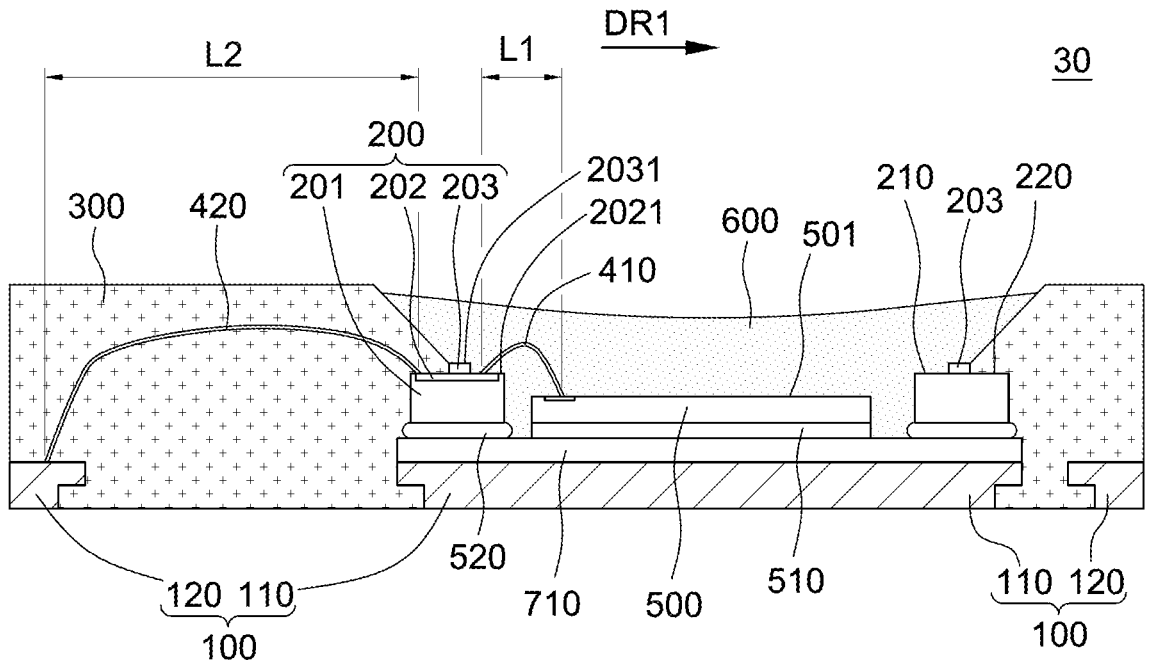
FIG. 4B illustrates a cross-sectional view of a semiconductor package structure in accordance with some embodiments of the present disclosure.

FIG. 4B illustrates a cross-sectional view of a semiconductor package structure in accordance with some embodiments of the present disclosure. In some embodiments, FIG. 4B may illustrate a cross-sectional view along the cross-sectional line II-II' in FIG. 4A.

In some embodiments, the length L1 of the conductive element 410 is defined as the distance between two ends of the conductive element 410 along the direction DR1. In some embodiments, the length L2 of the conductive element 420 is defined as the distance between two ends of the conductive element 420 along the direction DR1.

In some embodiments, a surface (also referred to as "an upper surface") of the interposer 200 is at an elevation higher than that of a surface 501 (also referred to as "an upper surface") of the semiconductor device 500. In some embodiment, the surface 2011 of the base layer 201 of the interposer 200 is at an elevation higher than that of the surface 501 of the semiconductor device 500. In some embodiment, the surface 2031 of the dam 203 of the interposer 200 is at an elevation higher than that of the surface 501 of the semiconductor device 500. According to some embodiments of the present disclosure, when implementing the interposer 200 elevated at the portion 110, the conductive wires (e.g., the conductive elements 420) between the portions 120 and the semiconductor device 500 can gain a sufficient loop height across the extended distance. The extended distance between at least one side of the semiconductor device 500 and the portion 120 (e.g., leads) is a common design in Hall sensor application where the magnetic field generated in the portion 110 (e.g., "I" shape die paddle) under the semiconductor device 500 is disposed away from the leads in reduction of the electromagnetic interference.

Figure 5:
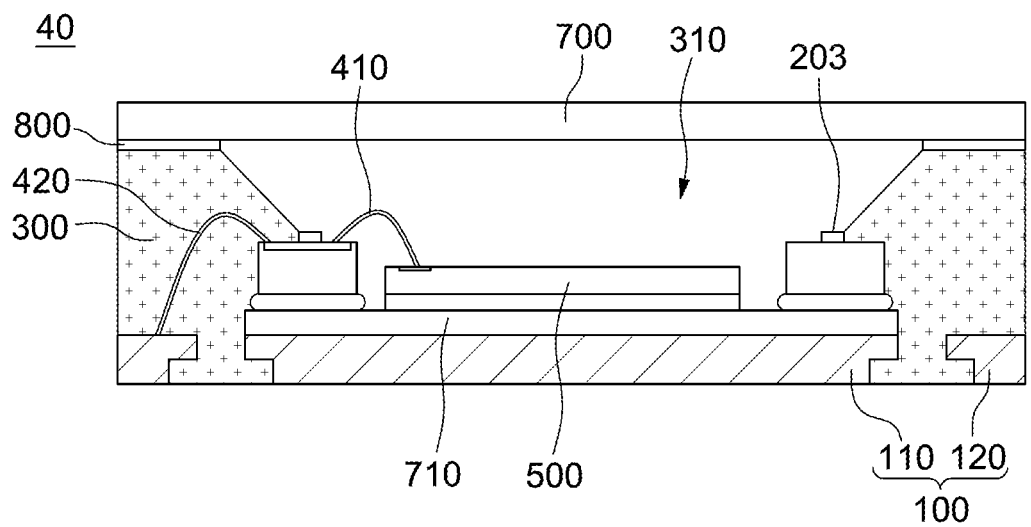
FIG. 5 illustrates a cross-sectional view of a semiconductor package structure in accordance with some embodiments of the present disclosure.

FIG. 5 illustrates a cross-sectional view of a semiconductor package structure 40 in accordance with some embodiments of the present disclosure. The semiconductor package structure 40 is similar to the semiconductor package structure 10 in FIG. 1 except that, for example, the semiconductor package structure 40 includes a cover 700 (also referred to as "a lid").

In some embodiments, the cover 700 is attached to the encapsulant 300 so as to enclose the cavity 310. In some embodiments, the cover 700 is attached to the encapsulant 300 through an adhesive layer 800. In some embodiments, the semiconductor package structure 40 is free from the encapsulant 600. In some embodiments, the cavity 310 is filled with air, resulting in an air-type semiconductor package structure 40. The cover 700 can serve to protect the semiconductor device 500 and the conductive elements 410 within the cavity 310.

FIG. 6A, FIG. 6B, FIG. 6C and FIG. 6D illustrate various operations in a method of manufacturing a semiconductor package structure in accordance with some embodiments of the present disclosure.

Figure 6A:
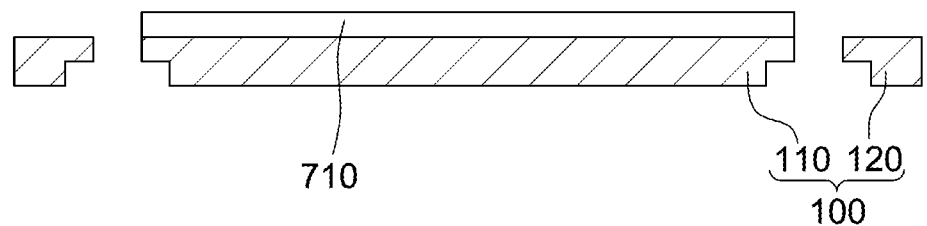
FIG. 6A, FIG. 6B, FIG. 6C and FIG. 6D illustrate various operations in a method of manufacturing a semiconductor package structure in accordance with some embodiments of the present disclosure.

Referring to FIG. 6A, a carrier 100 is provided. In some embodiments, the carrier 100 includes a portion 110 and portions 120 spaced apart from the portion 110. In some embodiments, an insulating layer 710 may be formed on the portion 110 of the carrier 100. In some other embodiments, an insulating layer 710 is not formed on the portion 110 of the carrier 100 (not shown in FIG. 6A).

Figure 6B:
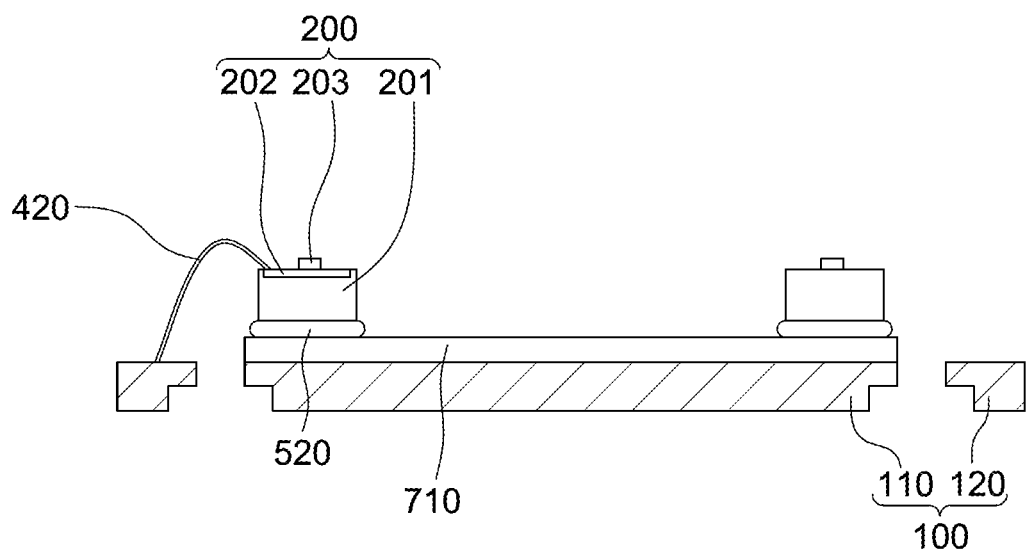

Referring to FIG. 6B, an interposer 200 is disposed on the carrier 100, and one or more conductive element 420 are formed on the interposer 200. In some embodiments, the conductive element 420 is formed by wire bond technology so as to bond the interposer 200 and the portion(s) 120 of the carrier 100. In some embodiments, the interposer 200 is connected to the portion 110 of the carrier 100 through an adhesive layer 520. In some embodiments, the interposer 200 is attached to the insulating layer 710 through the adhesive layer 520. In some other embodiments, the adhesive layer 520 directly contacts the interposer 200 and the portion 110 of the carrier 100 (not shown in FIG. 6B). In some embodiments, the interposer 200 includes a base layer 201, a conductive layer 202 formed proximate to a surface 2011 (also referred to as "an upper surface") of the base layer 201, and a dam 203 over the base layer 201.

Figure 6C:
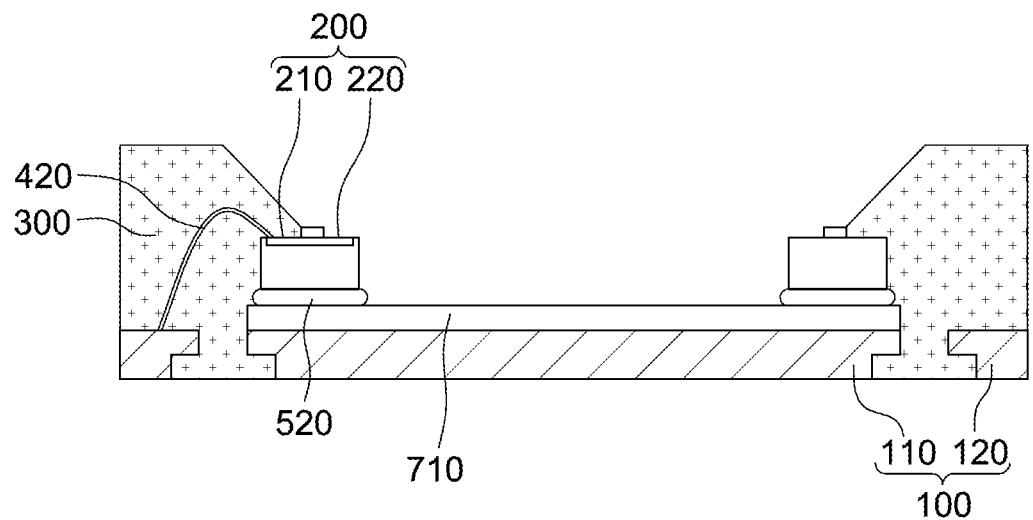

Referring to FIG. 6C, an encapsulant 300 is formed to cover a portion of the interposer 200. In some embodiments, the conductive element 420 is formed on a region 220 of the interposer 200, and the encapsulant 300 is formed to cover the region 210 of the interposer 200. In some embodiments, the encapsulant 300 is formed to cover the conductive element 420. In some embodiments, forming the conductive element 420 on the region 220 of the interposer 200 to be covered by the encapsulant 300 is prior to forming the encapsulant 300.

In some embodiments, the encapsulant 300 may be formed by the following operations: an open cavity mold is abutted to the portion (i.e., the region 220) of the interposer 200 from the above, preserving an open cavity space of the package. Subsequently, molding compound is applied to encapsulate the conductive element 420 and a portion (i.e., the region 210) of the interposer 200 exposed from the mold, and the molding compound is cured to form the encapsulant 300. In some embodiments, the mold abuts the dam 203 of the interposer 200 when applying the molding compound. According to some embodiments of the present disclosure, the dam 203 may be protruded from the upper surface of the interposer 200, such that the molding compound can be prevented from overflowing towards the area where the semiconductor device 500 and the conductive element 410 are supposed to be formed, and thus the residue or contamination of the molding compound on undesired area can be reduced.

Figure 6D:
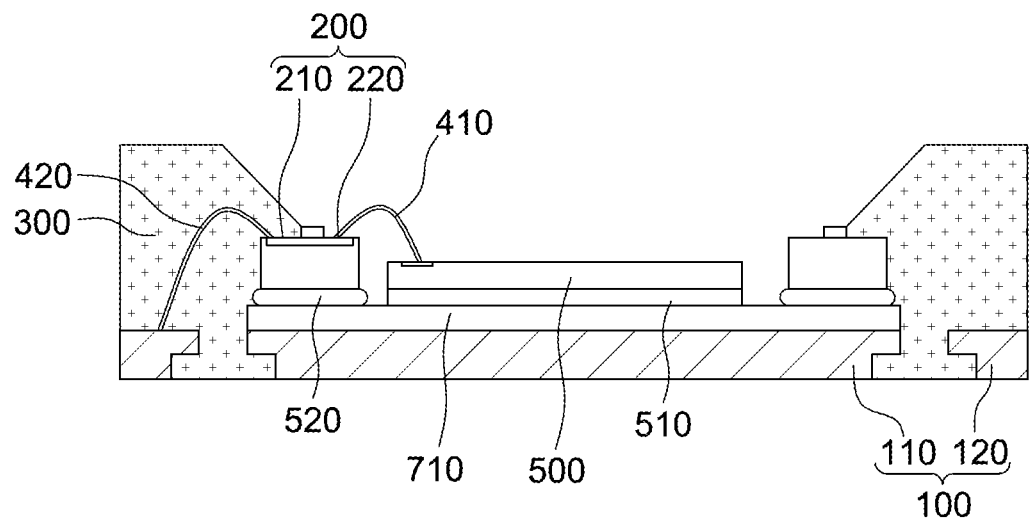

Referring to FIG. 6D, a semiconductor device 500 is disposed on the carrier 100, or in the open cavity space formed by the encapsulant 300. A conductive element 410 is formed on a region 210 of the interposer 200 exposed from the encapsulant 300. In some embodiments, the conductive element 410 connects the semiconductor device 500 and the region 210 of the interposer 200. In some embodiments, the semiconductor device 500 is disposed on the carrier 100 prior to forming the conductive element 410. In some embodiments, the semiconductor device 500 is disposed on the carrier 100 after forming the encapsulant 300. In some embodiments, the conductive element 410 is formed on the region 210 of the interposer 200 exposed from the encapsulant 300 after forming the encapsulant 300. According to some embodiments of the present disclosure, the encapsulant 300 is formed prior to disposing the semiconductor device 500 and forming the conductive element 410, such that the molding compound for forming the encapsulant 300 can be prevented from overflowing towards the semiconductor device 500 and forming the conductive element 410, such that residue or contamination of the molding compound is not formed on the semiconductor device 500, and thus the reliability of the process for forming the semiconductor package structure can be increased.

In some embodiments, referring to FIG. 3, after the conductive element 410 is formed, an encapsulant 600 is formed to cover the conductive element 410 and the semiconductor device 500. As such, the semiconductor package structure 20 shown in FIG. 3 is formed.

In some embodiments, referring to FIG. 5, after the conductive element 410 is formed, a cover 700 (also referred to as "a lid") is formed to cover the encapsulant 300, the interposer 200, the conductive element 410, and the semiconductor device 500. As such, the semiconductor package structure 40 shown in FIG. 5 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
   an interposer;
   a first conductive element and a second conductive element disposed on the interposer;
   a first encapsulant covering the second conductive element and exposing the first conductive element; and
   a semiconductor device surrounded by the interposer, wherein the first conductive element electrically connects the semiconductor device and the interposer.

2. The semiconductor package structure of claim 1, further comprising a second encapsulant covering the first conductive element.

3. The semiconductor package structure of claim 1, wherein the semiconductor device is electrically connected to a carrier through the first conductive element and the second conductive element.

4. The semiconductor package structure of claim 3, wherein the second conductive element electrically connects the carrier and the interposer.

5. The semiconductor package structure of claim 1, wherein the interposer comprises:
   a base layer;
   a conductive layer proximate to a surface of the base layer; and
   a dam disposed on the conductive layer and between the first conductive element and the second conductive element.

6. The semiconductor package structure of claim 5, wherein the first encapsulant defines a cavity, and at least a portion of the dam is exposed to the cavity.

7. The semiconductor package structure of claim 1, wherein the interposer is disposed on a carrier, and the carrier comprises a first portion and a plurality of second portions spaced apart from the first portion.

8. The semiconductor package structure of claim 7, further comprising a plurality of the second conductive elements respectively connected to the second portions of the carrier, wherein the first encapsulant covers the second conductive elements and the second portions of the carrier.

9. The semiconductor package structure of claim 7, wherein the semiconductor device is disposed on the first portion of the carrier and exposed from the first encapsulant.

10. The semiconductor package structure of claim 9, further comprising a plurality of the first conductive elements connected to the interposer and the semiconductor device, wherein the semiconductor device is electrically connected to the second portions of the carrier through the first conductive element and the second conductive element.

11. A semiconductor package structure, comprising:
    an interposer, comprising:
    a base layer;
    a conductive layer proximate to a surface of the base layer; and a dam disposed on the conductive layer;

a first conductive element and a second conductive element disposed on the interposer, wherein the dam of the interposer is between the first conductive element and the second conductive element; and a first encapsulant covering the second conductive element and exposing the first conductive element.

12. The semiconductor package structure of claim 11, wherein the first encapsulant defines a cavity, and at least a portion of the dam is exposed to the cavity.

13. The semiconductor package structure of claim 11, further comprising a carrier, wherein the first encapsulant is on the carrier and defining a cavity, the first encapsulant covers a portion of the interposer, and the interposer is disposed between the first encapsulant and the cavity.

14. The semiconductor package structure of claim 13, wherein the carrier comprises a first portion and a second portion spaced apart from the first portion from a cross sectional perspective.

15. The semiconductor package structure of claim 14, wherein the second conductive element connects the interposer and the second portion of the carrier.

16. The semiconductor package structure of claim 14, further comprising:

a semiconductor device disposed on the first portion of the carrier and exposed from the first encapsulant; and an insulating layer disposed between the semiconductor device and the first portion of the carrier.

17. The semiconductor package structure of claim 16, further comprising:

a second encapsulant covering the first conductive element, wherein the first conductive elements connects the interposer and the semiconductor device.

18. The semiconductor package structure of claim 11, wherein the first encapsulant covers a first region of the interposer and exposes a second region of the interposer, and the semiconductor package structure further comprises a second encapsulant covering the second region of the interposer.

* * * * *